United States Patent
Higashi et al.

(10) Patent No.: US 8,586,854 B2
(45) Date of Patent: Nov. 19, 2013

(54) THERMOELECTRIC CONVERSION ELEMENT

(75) Inventors: Kenji Higashi, Yamatotakada (JP); Yuji Hori, Osaka (JP); Yoshikazu Tanaka, Uji (JP); Yoji Yamada, Hirakata (JP); Kaoru Kishigui, Yamatotakada (JP); Akira Nakayama, Akashi (JP)

(73) Assignee: Da Vinci Co., Ltd., Nara (JP)

( * ) Notice: Subject to any disclaimer, the term of this patent is extended or adjusted under 35 U.S.C. 154(b) by 214 days.

(21) Appl. No.: 13/059,107

(22) PCT Filed: Aug. 17, 2009

(86) PCT No.: PCT/JP2009/064409
§ 371 (c)(1),
(2), (4) Date: Feb. 15, 2011

(87) PCT Pub. No.: WO2010/021313
PCT Pub. Date: Feb. 25, 2010

(65) Prior Publication Data
US 2011/0146742 A1 Jun. 23, 2011

(30) Foreign Application Priority Data
Aug. 18, 2008 (JP) .................. 2008-209603

(51) Int. Cl.
H01L 35/32 (2006.01)
H01L 35/30 (2006.01)
H01L 35/00 (2006.01)

(52) U.S. Cl.
CPC ............. *H01L 35/32* (2013.01); *H01L 35/00* (2013.01)
USPC ............................ 136/227; 136/224; 136/205

(58) Field of Classification Search
None
See application file for complete search history.

(56) References Cited

U.S. PATENT DOCUMENTS

| | | | | |
|---|---|---|---|---|
| 2,588,254 A | * | 3/1952 | Davis et al. .................. | 136/249 |
| 3,037,065 A | | 5/1962 | Hockings et al. | |
| 3,079,455 A | | 2/1963 | Haba | |
| 3,880,674 A | * | 4/1975 | Saunders ..................... | 136/237 |

(Continued)

FOREIGN PATENT DOCUMENTS

| | | |
|---|---|---|
| JP | A-58-209174 | 12/1983 |
| JP | A-3-66182 | 3/1991 |

(Continued)

OTHER PUBLICATIONS

Swindeman et al, An Investigation of Thermally-Sprayed Aluminum Oxide Coatings, International Symposium on Semiconductor Manufacturing (1995).*

(Continued)

*Primary Examiner* — Jennifer K. Michener
*Assistant Examiner* — Christopher Danicic
(74) *Attorney, Agent, or Firm* — Oliff & Berridge, PLC.

(57) ABSTRACT

A thermoelectric conversion element is configured to have two types of conductors with different Seebeck coefficients physically connected alternately with an electrode via one or more electrical resistance layers formed by electrical resistor having electrical resistance rate of $1 \times 10^{-3}$ $\Omega$cm or more. This arrangement enables charges to be generated by the difference of temperature in both ends of the element and to be densely stored in the electrical resistance layers formed by electrical resistor. Moreover, it is thought that thermal energy equivalent to the difference of temperature is input into the electrical resistance layers and that electromotive force increases as a result of an increase of output voltage.

10 Claims, 2 Drawing Sheets

(56) References Cited

U.S. PATENT DOCUMENTS

| | | |
|---|---|---|
| 6,614,109 B2 | 9/2003 | Cordes et al. |
| 2002/0069907 A1 | 6/2002 | Yamashita |
| 2005/0002818 A1* | 1/2005 | Ichikawa et al. .................. 419/6 |
| 2005/0161072 A1 | 7/2005 | Esser et al. |
| 2006/0048809 A1* | 3/2006 | Onvural ........................ 136/212 |
| 2007/0256722 A1 | 11/2007 | Kondoh |
| 2010/0065096 A1* | 3/2010 | Pellegrini ...................... 136/201 |
| 2010/0147351 A1 | 6/2010 | Takahashi |

FOREIGN PATENT DOCUMENTS

| | | |
|---|---|---|
| JP | A-07-38157 | 2/1995 |
| JP | A 9-092889 | 4/1997 |
| JP | A 11-054805 | 2/1999 |
| JP | A 11-274582 | 10/1999 |
| JP | A 2001-230455 | 8/2001 |
| JP | A-2001-308397 | 11/2001 |
| JP | A 2002-078367 | 3/2002 |
| JP | A 2002-118295 | 4/2002 |
| JP | A-2005-033069 | 2/2005 |
| JP | A 2006-019422 | 1/2006 |
| JP | A 2006-049796 | 2/2006 |
| WO | WO 2009/013960 A1 | 1/2009 |

OTHER PUBLICATIONS

Extended European Search Report issued in European Application No. 09808249.8 dated May 25, 2012.

International Search Report issued in PCT/JP2009/064409, mailed Nov. 17, 2009. (with English-language translation).

* cited by examiner

THERMOELECTRIC CONVERSION ELEMENT

TECHNICAL FIELD

The present invention relates to a thermoelectric conversion element.

BACKGROUND ART

Conventionally, Thomson effect, Seebeck effect and Peltier effect are known as effects relating to a thermoelectric conversion. Especially Seebeck effect is known as an effect directly converting thermal energy into electronic energy by the difference of temperature. However, Seebeck coefficient of conductors such as metals is too low to secure a necessary voltage and conductors are not practical for use. Therefore, semiconductors are developed and put to practical use.

Generally, a semiconductor using heavy metal such as bismuth telluride based material becomes mainstream.

Recently, a semiconductor using oxide and a element that provides feature for structure of semiconductor are developed.

Patent Document 1: Japanese Patent Laid-Open No. H9-092889
Patent Document 2: Japanese Patent Laid-Open No. 2001-230455
Patent Document 3: Japanese Patent Laid-Open No. 2002-078367
Patent Document 4: Japanese Patent Laid-Open No. 2002-118295
Patent Document 5: Japanese Patent Laid-Open No. 2006-019422

DISCLOSURE OF THE INVENTION

A Seebeck element is a very expensive thermoelectric conversion element because of a low production. The generated power does not correspond to costs and the popularization of the Seebeck element is late. Therefore, one of problems of the present invention includes providing an efficient thermoelectric conversion element that is worth the cost of manufacturing.

It is also necessary to control to begin the operation of power generation when the difference of temperature needed to be is caused to store generated power in a battery efficiently.

According to one aspect, the present invention is directed to a thermoelectric conversion element configured to have two types of conductors with different Seebeck coefficients physically connected alternately with an electrode via one or more electrical resistance layers formed by electrical resistor. The conductor may be any of various materials, for example, a metal, a metal oxide, a semiconductor or a mixture thereof. Especially the combination of N-type semiconductor and P-type semiconductor is preferable as the conductors with a large different Seebeck coefficient. "Physically connecting" includes not only electrically connecting but also connecting to an insulator via the solder, the adhesive or other materials. Physically connecting also includes directly contact. The thermoelectric conversion element may merely be called "element".

This arrangement enables charges to be generated by the difference of temperature in both ends of the element (ends at which the conductor is physically connected to the electrode) and to be densely stored in the electrical resistance layers formed by electrical resistor. Moreover, it is thought that thermal energy equivalent to the difference of temperature is input into the electrical resistance layers and accordingly output voltage increases by the electrical resistance layers and electromotive force increases by the increase of output voltage.

Moreover, in the case in which the insulator is adopted as the electrical resistance layers, the difference of temperature based on the thickness of the insulator in both ends of the element is caused and an electric current passes through the insulator. This resulted in a conduction is accomplished. There is a correlation among the thickness of the insulator, the difference of temperature required for the conduction and an induced voltage. The thicker the insulator is, the larger the difference of temperature required for the conduction is. The thicker the insulator is, the higher the induced voltage is. Controlling the thickness of the insulator enables to set the difference of temperature at which the electric generation is begun and the induced voltage. Using this structure, the thermoelectric conversion element is used as a temperature switch.

This structure enables the carrier density by the electric charge generated by Seebeck effect to be intentionally high. This structure accomplishes the higher induced voltage than that of the Seebeck element being connected by the electrode having no electrical resistance layer.

Typical examples of the electrical resistor include a semiconductor and an insulator having resistance value based on an area of the electrical resistance layers in the direction of the conduction and a thickness of the electrical resistance layers from 0.01 Ω to 100 MΩ. Preferable examples of the electrical resistor include a semiconductor and an insulator having resistance value from 1 Ω to 100 kΩ. In the present invention, the resistance value may calculate by a formula (the resistance rate × length (the thickness of the electrical resistance layers) ÷ cross-section area). In the present invention, the electrical resistance rate includes the electrical resistance rate at 0 degrees Celsius and is merely called a resistance rate below. In the present invention, the semiconductor that can be used as the electrical resistor may have electrical resistance rate of $1 \times 10^3$ Ωcm or more. A preferable semiconductor that can be used as the electrical resistor may have electrical resistance rate of $1 \times 10^6$ Ωcm or less. More preferable semiconductor that can be used as the electrical resistor may have electrical resistance rate from 10Ωcm to $1 \times 10^6$ Ωcm. The semiconductor that can be used as the electrical resistor may have the thickness from 100 nm to 1 mm. In the case in which the semiconductor is used as the electrical resistor, it is preferable to use an intrinsic semiconductor such as silicon and germanium as the semiconductor or to use a semiconductor formed with a mixture of P-type semiconductor and N-type semiconductor as the semiconductor. In the present invention, the insulator that can be used as the electrical resistor have electrical resistance rate of $1 \times 10^6$ Ω or more, more preferable electrical resistance rate from $1 \times 10^6$ Ω to less than $1 \times 10^{16}$ Ω, and have the thickness from about 1 nm to 100 nm. In the insulator, compared with the semiconductor, the difference of temperature needed to generate electromotive force remarkably changes based on the thickness of the insulator. It is preferable that the insulator is selected from the material such as resin films, oxide film, nitride film and fluoride film and formed from a mixed or stacked structure thereof. The range of the thickness may generally include the thickness that exceeds such thickness as the tunnel current can flow. However, the charge transfer is occurred in such range. It is assumed that this is because the large potential difference based on the difference of temperature is caused by the heat load among conductors with the different Seebeck coefficient. For example, there is large difference between the Seebeck coefficient of P-type semiconductor and that of N-type semiconductor and the potential difference is accordingly caused.

The electric resistance layer plays a role as capacitor. The charges generated by the difference of temperature in both ends of the element are stored in the electric resistance layer in a high density. In this environment, thermal energy corresponding to the difference of temperature in both ends of the element is input in the electric resistance layer. The charges are stored in interface of the electric resistance layer in a high density. The charges become electromotive force by the breakthrough. Consequently output voltage is in an increased state compared with the case without the electric resistance layer. Accordingly, it is assumed that electric power is taken out efficiently. It is assumed that this phenomenon is occurred in the case in which the insulator and the semiconductor are placed in the electric resistance layers as the electric resistor.

The thermoelectric conversion element is connected via the electrical resistor. The electrical resistance layers play a role as capacitor and store charges. Charges generated by the heat load raise carrier density in the interface of the electrical resistance layers and the thermoelectric conversion element accordingly improves thermoelectric efficiency greatly.

In the metals with low Seebeck coefficient, the thermoelectric conversion element provides a low-cost and high efficient element by the rise of the carrier density caused by the electrical resistance layers and by the effect of the easy breakthrough of the carrier caused by the heat load.

MODES OF CARRYING OUT THE INVENTION

The best modes of carrying out a thermoelectric conversion element of the present invention in a performance is the configuration that selects P-type semiconductor and N-type semiconductor as two types of conductors with different Seebeck coefficient and places electrical resistance layers formed of an insulator on one connected portion of an electrode connected to two conductors. The best modes of carrying out the thermoelectric conversion element of the present invention in cost is the configuration that selects metals as two types of conductors with different Seebeck coefficient and places electrical resistance layers formed of an semiconductor on one connected portion of a electrode connected to the metals.

Figure 1:
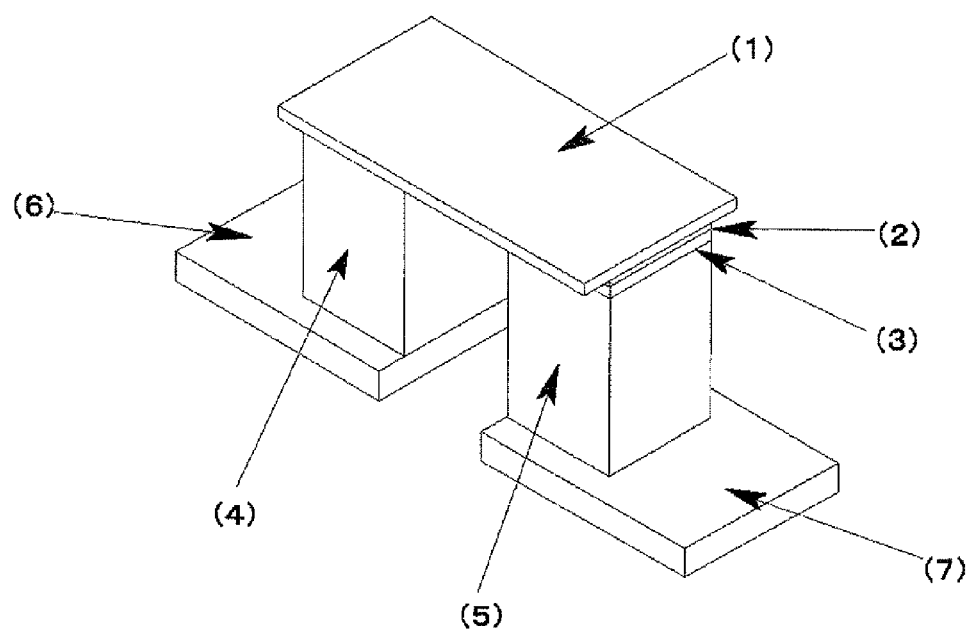
FIG. 1 is a perspective view of a pair of the thermoelectric conversion element (a first embodiment)
Figure 2:
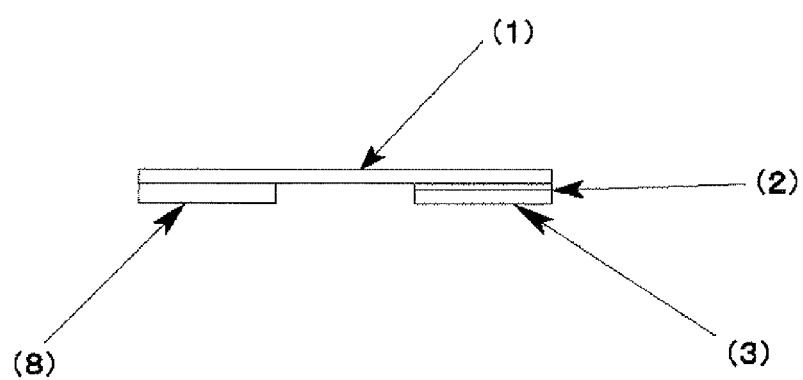
FIG. 2 is a cross section of an electrode member (the first embodiment)
Figure 3:
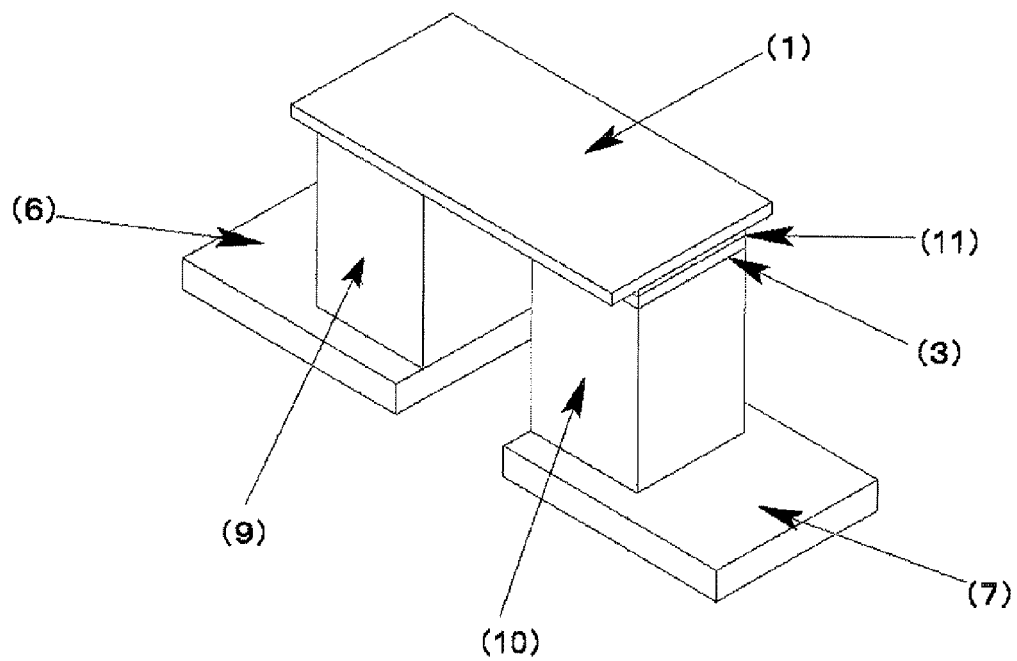
FIG. 3 is a reference of a pair of the thermoelectric conversion element (the first embodiment)

One mode of carrying out the invention is explained referred from FIG. 1 to FIG. 3. FIG. 1 is a perspective view of one pair of the thermoelectric conversion element of this embodiment and FIG. 2 is a cross section of an electrode member of the embodiment. FIG. 3 is a reference of the thermoelectric conversion element that is changed to a configuration of the material in the thermoelectric conversion element of the embodiment and table 1 is a chart showing the result of measuring an electromotive force. The electrode member in FIG. 2 is combined by joining or bonding an electrode (1) to an insulator protecting member (3) with an electrical resistance layer (2) placed on the electrode (1) only on one side of the electrode. The electrode member is connected to a P-type semiconductor (5) via the insulator protecting member (3). One end of the electrode (1) is connected to an N-type semiconductor (4) via a conducting layer (8) for height adjustment. The P-type semiconductor (5) is connected to a lower electrode P (7). The N—type semiconductor (4) is connected to a lower electrode N (6). Thus one pair of the thermoelectric conversion element is formed. These lower electrodes are shared by the thermoelectric conversion elements and next thermoelectric conversion elements. These lower electrodes are used to place the N-type and the P-type alternately. These lower electrodes successively bond in series a plurality of the thermoelectric conversion elements. In the embodiment, a thin film insulator is adopted as the electrical resistance layer (2). The thin film may be exchanged for an intrinsic semiconductor (11) of the configuration in FIG. 3. The P-type semiconductor (5) and the N-type semiconductor (4) may be exchanged to a metal 1 (9) and a metal 2 (10) being different kind of each other metal.

In the experiment of the embodiment, the lower electrodes are used as the electrodes for measuring the electromotive force. Materials used in the experiment and a method of production are as follows. A low-resistivity silicon wafer is adopted as the electrode (1). A $SiO_2$ film is formed to the thickness of 50 nm on the low-resistivity silicon wafer by ion-beam sputtering and becomes the electrical resistance layer (2). An aluminum film is formed to the thickness of 200 nm on the $SiO_2$ film by ion-beam sputtering and becomes the insulator protecting member (3). Conditions of a deposition are an achievement degreed of vacuum of $3.3\times10^{-6}$ Toor, a degreed of vacuum of $7\times10^{-5}$ Toor at a deposition, Ar sputter gas, no substrate heating, a rotational speed of a substrate of 3 rpm, an ion beam power of 100 mA at 800 V at $SiO_2$ deposition (a vapor deposition rate of 0.033 nm/second) and the ion beam power of 200 mA at 1200 V at Al deposition (a vapor deposition rate of 0.1267 nm/second). A bismuth telluride based semiconductor produced for commercial Peltier elements is used as the semiconductor. The bismuth telluride based semiconductor is Seebeck coefficient of about 200 μV/K. The semiconductor, the electrode member and lower electrodes are fixed by conductive adhesive and electrically connected. The method of the deposition is not limited to ion-beam sputtering. The material of the electrical resistance layer (2) is not limited to $SiO_2$.

The summary of the experiment is as follows. The thermoelectric conversion element is heated from the electrode (1) by a Peltier element, K-type thermocouples are placed for measuring the temperature of the electrode (1) and the temperature of the lower electrodes. The induced voltage generated between the lower electrode P and the lower electrode N and data measured by the K-type thermocouples is recorded to data logger.

The result of verification of the experiment is illustrated with reference to a table 1. No. 1 of the measurement data is the data of a thermoelectric conversion element configured to bond the bismuth telluride based semiconductor to the electrode with epoxy based conductive adhesive. No. 1 of the measurement data is assumed to be a common bismuth telluride based Seebeck element and is adopted as the standard. Items described in the table are illustrated as follows. Illustrating the items, symbol of delta in the table is exchanged for symbol of Δ by constraint of describing the description. From the left in the table, sample number is filled in measurement data item, and the difference of temperature between upper part and lower part of the element (the difference of temperature at the point of conduction, except the standard) is filled in ΔT degrees C. Difference between induced voltage at previous ΔT and initial value of 0 mV is filled in ΔV mV by a mV, and induced voltage per 1 degrees C. is filled in V/T mV. The thickness of the insulator is filled in the thickness of the film and is assumed to have a margin of errors of plus or minus 3% in some measurement point. No. 5 is the thermoelectric conversion element configured to have the electrode member with the thickness of the insulator of 25 nm. No. 5 conducts by the difference of temperature of 7 degrees. Compared to the standard of No. 1, ΔV in No. 5 is higher value. The same samples are used as No. 8-1 and No. 8-2. No. 8-1 is measured with the electrical resistance layers placed to both side of P-type semiconductor and N-type semiconductor. No. 8-2 is configured to have the electrode directly connected to N-type semiconductor so that the electrical resistance layers become effective only for P-type semiconductor. As a result, data of No. 8-2 is excellent. These results can be all duplicated and it is not assumed that a conduction state is accomplished by the dielectric breakdown.

TABLE 1

| the measurement data | ΔT °C. | ΔVmV | V/TmV | the thickness of the film | remarks column |
|---|---|---|---|---|---|
| No 1 | 8.45 | 3.07 | 0.36 | | the standard |
| No 5 | 7.02 | 3.37 | 0.48 | 25 nm | |
| No 8-1 | 59.28 | 20.48 | 0.35 | 50 nm | |
| No 8-2 | 44.60 | 20.87 | 0.47 | 50 nm | the electrode is processed |

INDUSTRIAL APPLICABILITY

The thermoelectric conversion element does not have a drive member because of structure of the thermoelectric conversion element and the lifetime of the thermoelectric conversion element is long. Improvement of efficiency in the present invention enables low thermal energy discarded in factories or homes to be converted into electric energy and to be reused. There is various usage such as the generator using difference of temperature that takes advantage of heat generation of CPU of notebook computer and that charges battery by generated electric power. Especially, recently to calling out the control of global warming, the system converting a little difference of temperature into electric power with a handy device becomes indispensable technology for the industrialization.

The invention claimed is:

1. A thermoelectric conversion element comprising a plurality of electrode arrangements, each electrode arrangement comprising:
   an electrode having a first surface;
   a first conductor, having a first Seebeck coefficient, in direct physical and electrical contact with the first surface of the electrode; and
   a second conductor, having a second Seebeck coefficient different than the first Seebeck coefficient, in physical and electrical contact with the first surface of the electrode via an electrical resistance layer; wherein:
   the electrical resistance layer is formed by an electrical resistor having an electrical resistance of $1\times10^{-3}$ Ω-cm or more at 0° C.;
   the electrical resistance layer is disposed in direct physical contact with the first surface of the electrode; and
   the second conductor is physically and electrically connected to the electrical resistance layer such that the electrical resistance layer is disposed between the second conductor and the electrode.

2. The thermoelectric conversion element in accordance with claim 1, wherein the first conductor is a P-type semiconductor, and the second conductor is an N-type semiconductor.

3. The thermoelectric conversion element in accordance with claim 1, wherein the electrical resistor is an intrinsic semiconductor.

4. The thermoelectric conversion element in accordance with claim 1, wherein the electrical resistor is an insulator having an electrical resistance rate of $1\times10^6$ Ωcm or more.

5. The thermoelectric conversion element in accordance with claim 1, wherein the first conductor is an N-type semiconductor, and the second conductor is a P-type semiconductor.

6. A thermoelectric conversion element comprising a plurality of electrode arrangements, each electrode arrangement comprising:
   an electrode having a first surface;
   a first conductor, having a first Seebeck coefficient, in direct physical and electrical contact with a conducting layer wherein the conducting layer is in direct physical and electrical contact with the first surface of the electrode; and
   a second conductor, having a second Seebeck coefficient different than the first Seebeck coefficient, in physical and electrical contact with the first surface of the electrode via an electrical resistance layer; wherein:
   the electrical resistance layer is formed by an electrical resistor having an electrical resistance of $1\times10^{-3}$ Ω-cm or more at 0° C.;
   the electrical resistance layer is disposed in direct physical contact with the first surface of the electrode; and
   the second conductor is physically and electrically connected to the electrical resistance layer such that the electrical resistance layer is disposed between the second conductor and the electrode.

7. The thermoelectric conversion element in accordance with claim 6, wherein the first conductor is a P-type semiconductor, and the second conductor is an N- type semiconductor.

8. The thermoelectric conversion element in accordance with claim 6, wherein the first conductor is an N-type semiconductor, and the second conductor is a P-type semiconductor.

9. The thermoelectric conversion element in accordance with claim 6, wherein the electrical resistor is an intrinsic semiconductor.

10. The thermoelectric conversion element in accordance with claim 6, wherein the electrical resistor is an insulator having an electrical resistance rate of $1\times10^6$ Ω-cm or more.

* * * * *